US012696571B2

(12) United States Patent
Fu et al.

(10) Patent No.: US 12,696,571 B2
(45) Date of Patent: Jul. 28, 2026

(54) METHOD FOR RECYCLING SOLAR PANEL AND SOLAR PANEL RECYCLING SYSTEM FOR IMPLEMENTING THE SAME

(71) Applicants: Taiwan Solar Greenergy Corporation, Tainan City (TW); TSGC Technologies Inc., Tainan City (TW)

(72) Inventors: Yao-Hsien Fu, Kaohsiung City (TW); Chia-Tsung Hung, Tainan City (TW)

(73) Assignee: TSGC TECHNOLOGIES INC., Tainan City (TW)

( * ) Notice: Subject to any disclaimer, the term of this patent is extended or adjusted under 35 U.S.C. 154(b) by 448 days.

(21) Appl. No.: 18/357,848

(22) Filed: Jul. 24, 2023

(65) Prior Publication Data

US 2024/0304745 A1 Sep. 12, 2024

(30) Foreign Application Priority Data

Mar. 10, 2023 (TW) ................................. 112108834

(51) Int. Cl.
*H10F 71/00* (2025.01)
*H10P 74/20* (2026.01)
(52) U.S. Cl.
CPC ........... *H10F 71/00* (2025.01); *H10P 74/203* (2026.01)
(58) Field of Classification Search
CPC ......... H10F 71/00; H10F 19/80; H01L 22/12; B03B 9/062; B09B 3/30; B09B 2101/15; B29B 17/02; G06F 16/21; G06Q 50/26
See application file for complete search history.

(56) References Cited

U.S. PATENT DOCUMENTS

2023/0339002 A1* 10/2023 Chuang ............... B02C 19/0056

FOREIGN PATENT DOCUMENTS

| | | | | | |
|---|---|---|---|---|---|
| JP | 2004505273 | A | * 2/2004 | ........... | B29C 37/005 |
| JP | 3222564 | U | * 8/2019 | | |
| KR | 102091346 | B1 | * 3/2020 | ........... | B09B 3/0083 |

* cited by examiner

*Primary Examiner* — Charles Cai
(74) *Attorney, Agent, or Firm* — Birch, Stewart, Kolasch & Birch, LLP

(57) ABSTRACT

A method for recycling a solar panel that is to be implemented by a solar panel recycling system is provided. The solar panel recycling system includes a measuring equipment, a removal equipment, and a control unit. The solar panel includes a cover layer and a base layer. The method includes steps of: the measuring equipment measuring a first height of the cover layer and a second height of the base layer; the control unit obtaining a first parameter based on the second height, obtaining a second parameter based on the first height; the control unit controlling the removal equipment, according to the first parameter, to physically remove a portion of the solar panel to obtain a main body remainder; and the control unit controlling the removal equipment, according to the second parameter, to physically remove a portion of the main body remainder to obtain a cover remainder.

20 Claims, 7 Drawing Sheets

METHOD FOR RECYCLING SOLAR PANEL AND SOLAR PANEL RECYCLING SYSTEM FOR IMPLEMENTING THE SAME

CROSS-REFERENCE TO RELATED APPLICATION

This application claims priority to Taiwanese Invention patent application Ser. No. 112108834, filed on Mar. 10, 2023.

FIELD

The disclosure relates to a method for recycling, and more particularly to a method for recycling a solar panel and a system for implementing the same.

BACKGROUND

A solar panel includes a cover layer, a base layer, and a solar cell unit for converting energy of light into electric power. The solar cell unit is made up of a plurality of solar cells and is sandwiched between the cover layer and the base layer. The solar cell unit has its service life, and the solar panel may be discarded or unusable after the solar cell unit has passed its service life. Thus, there are some conventional methods for recycling solar panels to turn the discarded or unusable solar panels into reusable resources.

The cover layer is usually a piece of tempered glass that can be recycled or reused as a whole, while the base layer and the solar cell unit are better suited to be crushed and recycled separately. Therefore, when recycling a solar panel, it is preferable to remove the base layer and the solar cell unit without damaging the cover layer. The conventional methods for recycling a solar panel generally include a removal process such as chemically or thermally decomposing the base layer and the solar cell unit, or physically removing the base layer and the solar cell unit by milling or grinding. However, since there are more than 17,000 specifications of solar panels at present, it may be hard to perform the conventional methods in an efficient and automatic way.

SUMMARY

An object of the disclosure is to provide a method for recycling a solar panel that can alleviate at least one of the drawbacks of the prior art.

According to the disclosure, a method for recycling a solar panel that is to be implemented by a solar panel recycling system is provided. The solar panel recycling system includes a capturing device, a measuring equipment, a removal equipment, and a control unit. The solar panel includes a cover layer and a base layer, and has a product label attached thereon. The solar panel is placed horizontally on a work surface of a workbench, and the method includes steps of: the capturing device obtaining label data from the product label of the solar panel, and the control unit obtaining product information of the solar panel according to the label data obtained from the capturing device; the measuring equipment measuring a first height from the work surface to a top surface of the cover layer of the solar panel, and a second height from the work surface to a bottom surface of the base layer of the solar panel, where the second height is higher than the first height; and the control unit executing a processing procedure. The processing procedure includes obtaining a first removal parameter that is related to the base layer and a second removal parameter that is related to the cover layer respectively according to the second height and the first height, controlling the removal equipment, according to the first removal parameter, to physically remove a portion of the solar panel that is substantially above the second height with respect to the work surface to obtain a main body remainder, and controlling the removal equipment, according to the second removal parameter, to physically remove a portion of the main body remainder that is substantially above the first height with respect to the work surface to obtain a cover remainder that includes at least the cover layer.

According to the disclosure, a solar panel recycling system adapted to implement the method for recycling a solar panel is provided. The solar panel is placed horizontally on a work surface of a workbench and has a product label attached thereon. The solar panel includes a cover layer and a base layer. The solar panel recycling system includes a capturing device, a measuring equipment, a removal equipment, and a control unit. The capturing device is configured to obtain label data from the product label of the solar panel. The measuring equipment is configured to measure a first height from the work surface to a top surface of the cover layer of the solar panel, and a second height from the work surface to a bottom surface of the base layer of the solar panel, where the second height is higher than the first height. The removal equipment is configured to perform physical removal. The control unit is configured to obtain product information of the solar panel according to the label data obtained from the capturing device, and to execute a processing procedure. The processing procedure includes steps of: obtaining a first removal parameter that is related to the base layer and a second removal parameter that is related to the cover layer respectively according to the second height and the first height, controlling the removal equipment, according to the first removal parameter, to physically remove a portion of the solar panel that is substantially above the second height with respect to the work surface to obtain a main body remainder, and controlling the removal equipment, according to the second removal parameter, to physically remove a portion of the main body remainder that is substantially above the first height with respect to the work surface to obtain a cover remainder that includes at least the cover layer.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
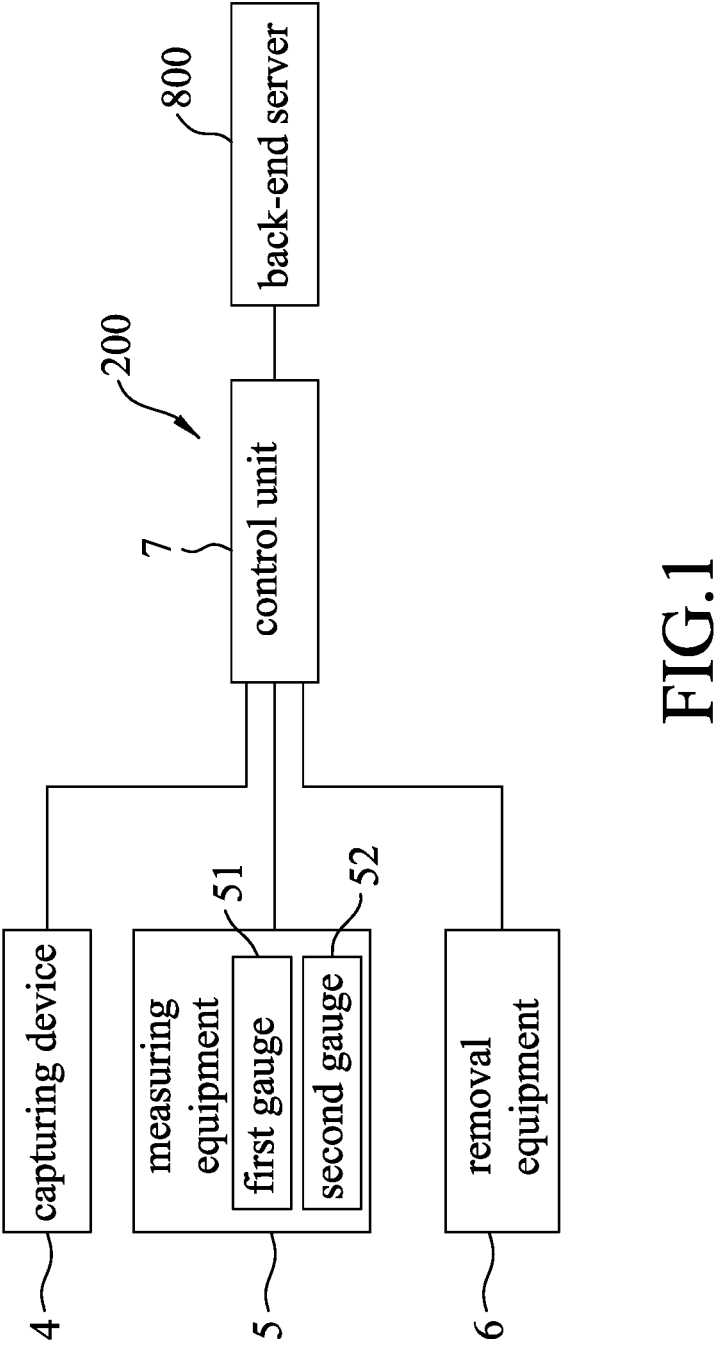
FIG. 1 is a block diagram illustrating a solar panel recycling system according to an embodiment of the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 2:
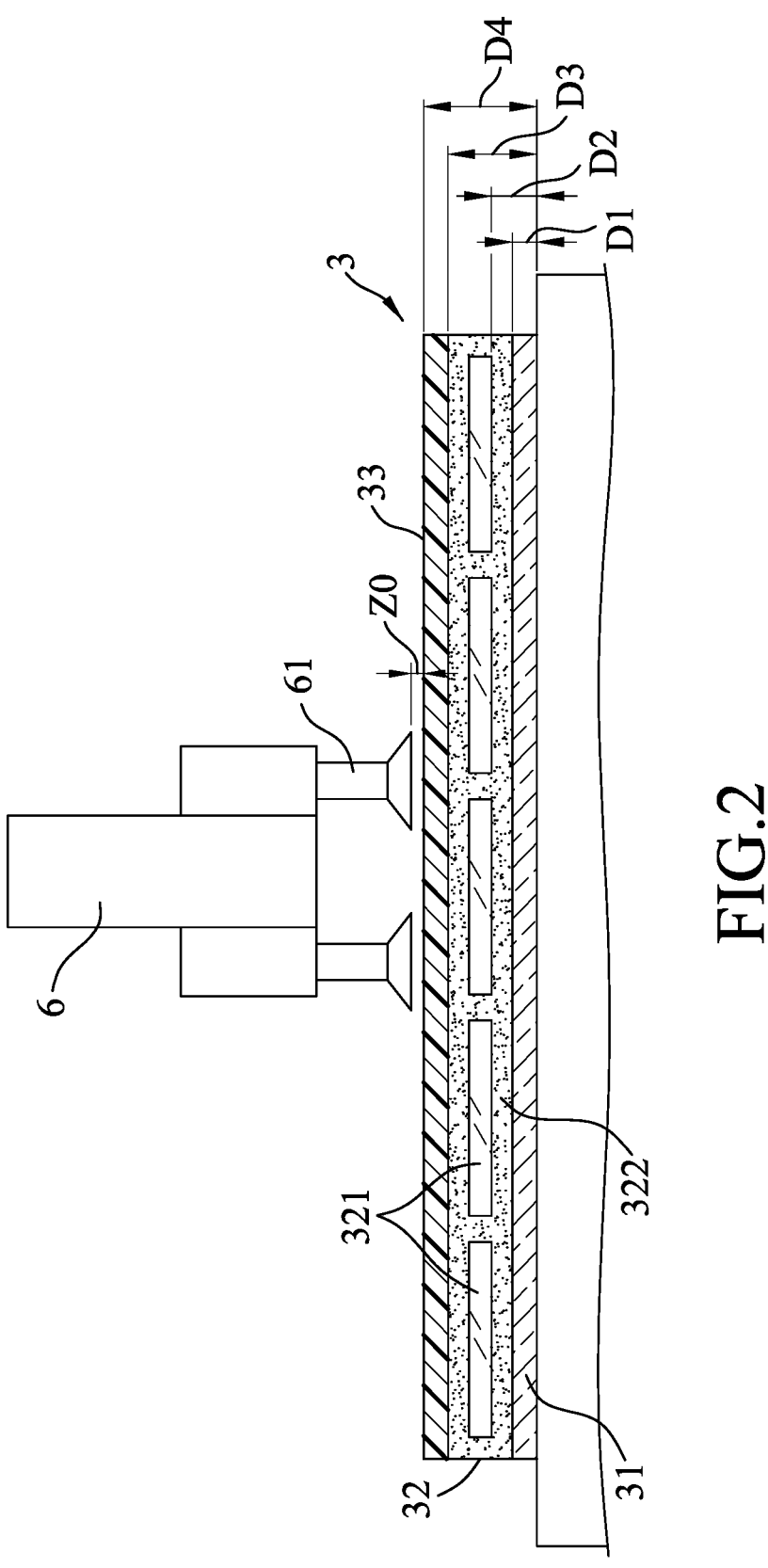
FIG. 2 is a schematic view illustrating a cross section of a solar panel having multiple layers.

Referring to FIGS. 1 and 2, a solar panel recycling system 200 adapted to implement a method for recycling a solar panel 3 that is placed horizontally on a work surface 900 (see FIG. 3) is provided. In this embodiment, the solar panel recycling system 200 is configured to communicate and exchange data with a back-end server 800.

It should be noted that throughout the disclosure, when referring to a "top surface" of a component, the "top surface" of the component is a horizontal surface that is farther away from the work surface 900 compared to the other horizontal surface(s) of the component. Similarly, when referring to a "bottom surface" of a component, the "bottom surface" of the component is a horizontal surface that is closer to the work surface 900 compared to the "top surface" of the component.

The solar panel 3 includes a cover layer 31, a solar cell unit 32 that is fixedly stacked on a top surface of the cover layer 31, and a base layer 33 that is fixedly stacked on a top surface of the solar cell unit 32. That is to say, the solar panel 3 is placed on the work surface 900 in a manner that the base layer 33 is farther away from the work surface 900 than the cover layer 31.

The solar cell unit 32 includes an adhesive layer 322 bonded to the cover layer 31 and the base layer 33, and a plurality of solar cells 321 that are embedded in the adhesive layer 322. The solar cells 321 are spaced apart from each other and are arranged in a matrix. The adhesive layer 322 has a bottom part bonded to the cover layer 31, a top part bonded to the base layer 33, and a plurality of intermediate parts connected between the top part and the bottom part and filling a plurality of gaps among the solar cells 321. The cover layer 31 and the adhesive layer 322 are each made of a transparent material, and the base layer 33 is made of an opaque material, and the cover layer 31 may be a glass, and the adhesive layers 322 may be, but not limited to, an ethylene vinyl acetate (EVA) film.

The solar panel recycling system 200 includes a capturing device 4, a measuring equipment 5, a removal equipment 6, and a control unit 7 that is electrically connected to the capturing device 4, the measuring equipment 5, and the removal equipment 6. In this embodiment, the control unit 7 is configured to communicate and exchange data with the back-end server 800. The control unit 7 may be embodied using a computing device (e.g., a personal computer, a laptop, a smart mobile phone, a tablet, etc.), and include, but not limited to, a single core processor, a multi-core processor, a dual-core mobile processor, a microprocessor, a microcontroller, a digital signal processor (DSP), a field-programmable gate array (FPGA), an application specific integrated circuit (ASIC), and/or a radio-frequency integrated circuit (RFIC), etc.

Figure 3:
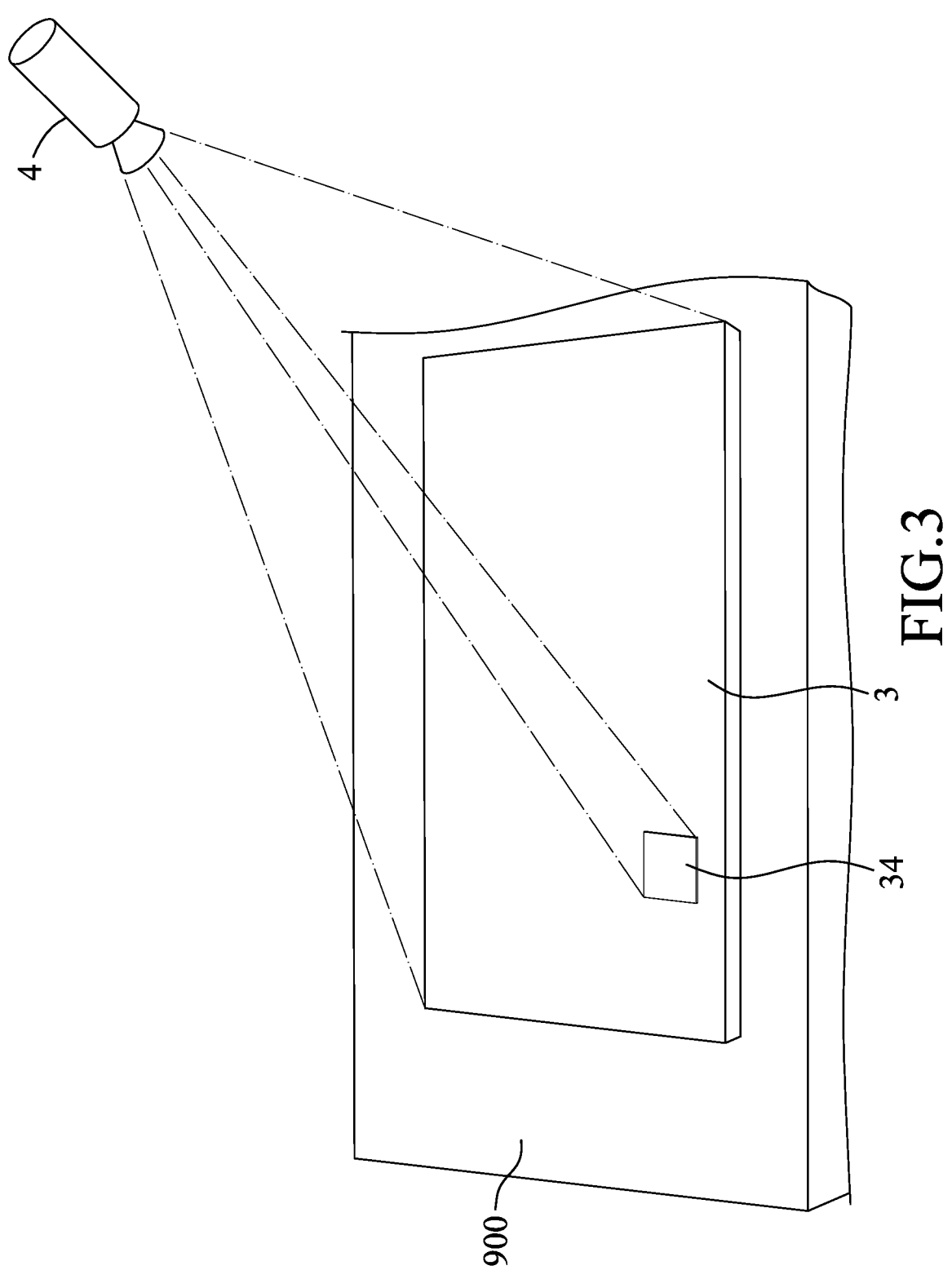
FIG. 3 is a schematic view illustrating a capturing device capturing an image of the solar panel according to an embodiment of the disclosure.

Further referring to FIG. 3, the solar panel 3 has a product label 34 attached thereon. The product label 34 records product information of the solar panel 3, and is disposed on a top surface of the base layer 33. The capturing device 4 is disposed above the work surface 900 and is configured to be controlled by the control unit 7 to face downward (i.e., facing the solar panel 3) to capture an image of the solar panel 3 as a whole (hereinafter referred to as "solar panel image"), and obtain label data from the product label 34. In this embodiment, the capturing device 4 is a camera that is configured to capture an image of the product label 34 as the label data.

Figure 4:
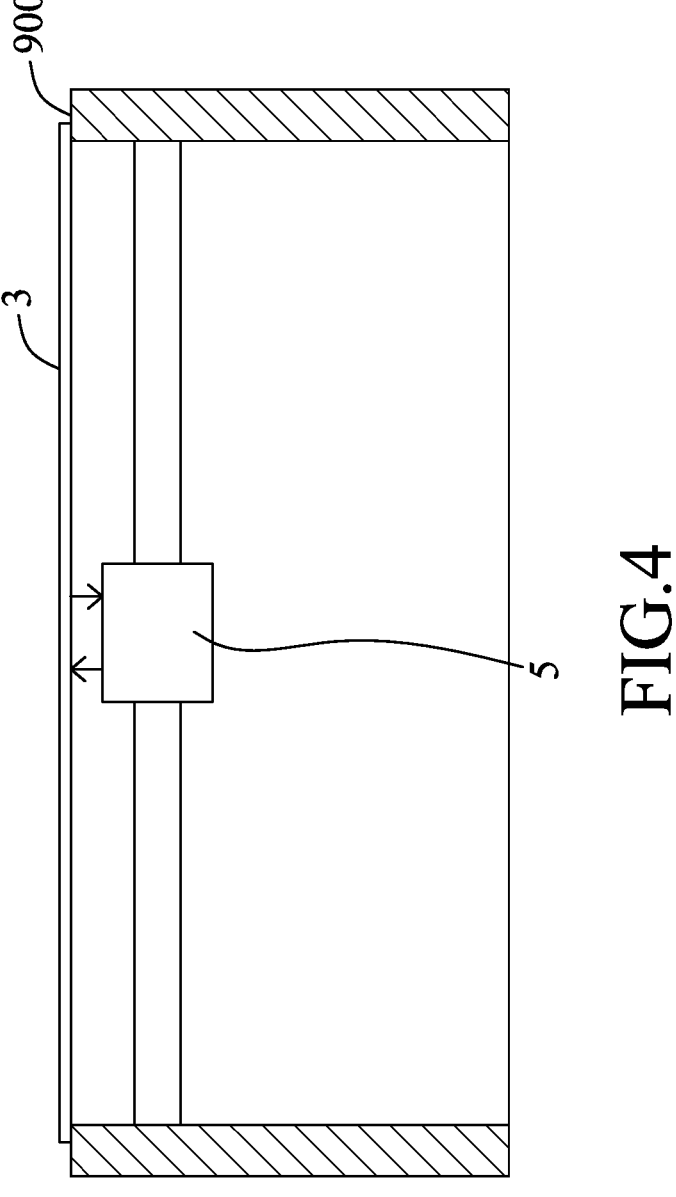
FIG. 4 is a schematic view illustrating a measuring equipment measuring various dimensions of the solar panel according to an embodiment of the disclosure.

Referring to FIGS. 1, 2, and 4, the measuring equipment 5 is disposed below the work surface 900 and includes a first gauge 51 and a second gauge 52. The first gauge 51 is configured to be controlled by the control unit 7 to emit a first infrared light with a first power upwardly to the solar panel 3. Preferably, the first power of the first infrared light is designed so that the first infrared light is able to be completely absorbed by the solar cells 321 without being reflected by the solar cells 321 and passing through one of the gaps among the solar cells 321 toward the base layer 33. The first infrared light with the first power can be reflected by a bottom surface of the base layer 33 and then be received by the first gauge 51. The first gauge 51 is configured to analyze the first infrared light reflected by the solar panel 3 to measure a height (D3) from the work surface 900 to the bottom surface of the base layer 33 (hereinafter referred to as "bottom-base-layer height").

The second gauge 52 is configured to be controlled by the control unit 7 to measure a height (D1) from the work surface 900 to the top surface of the cover layer 31 (hereinafter referred to as "top-cover-layer height"). In this embodiment, the second gauge 52 measures the top-cover-layer height (D1) by emitting an ultraviolet (UV) light with a second power upwardly to the solar panel 3, and analyzing the UV light reflected by the solar panel 3. In some embodiments, the second gauge 52 may measure the top-cover-layer height (D1) using sound wave, eddy current, etc. It should be noted that ways of measuring the top-cover-layer height (D1) by the second gauge 52 are not limited to the abovementioned examples.

Figure 5:
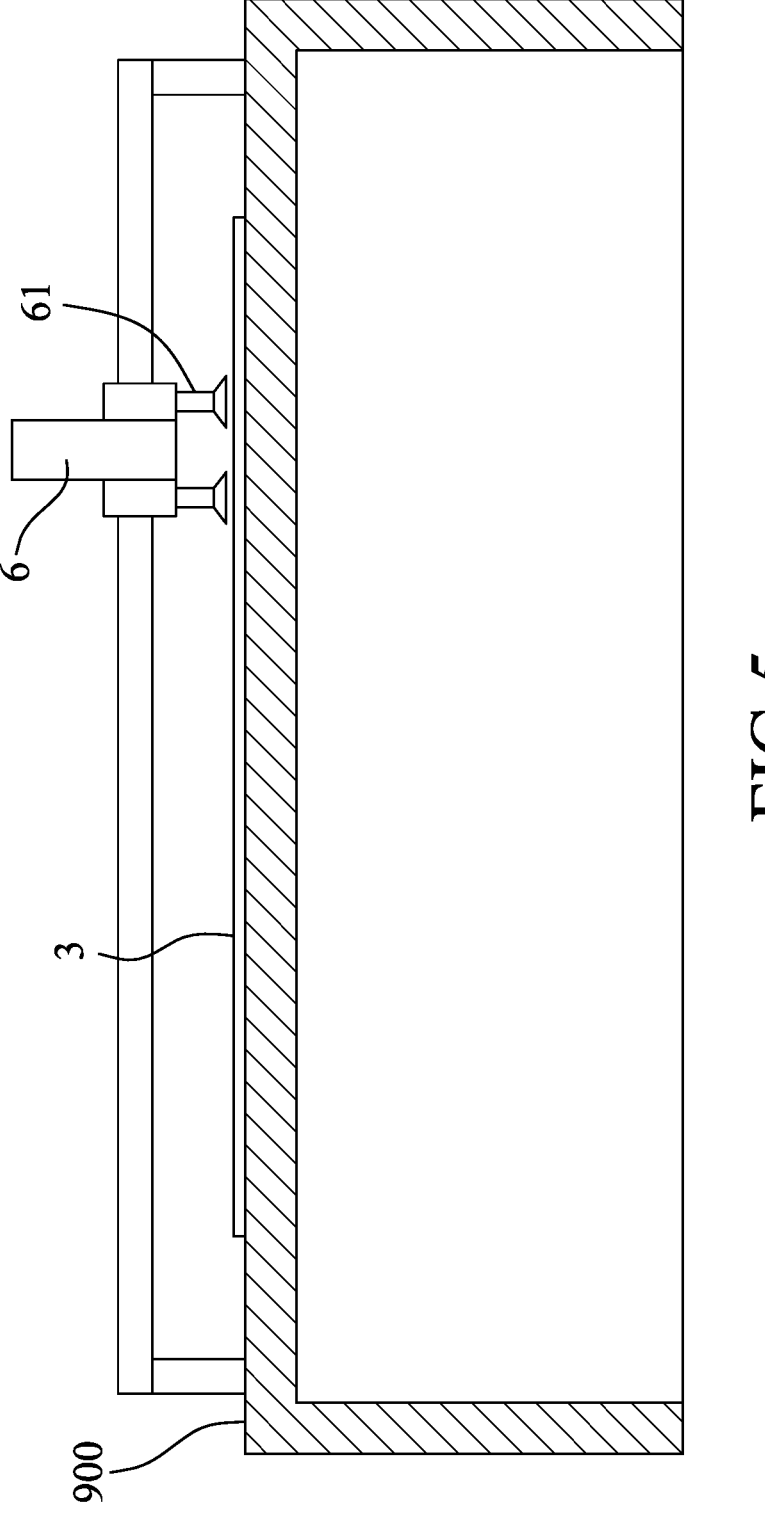
FIG. 5 is a schematic view illustrating a removal equipment according to an embodiment of the disclosure.

Referring to FIGS. 1, 2, and 5, the removal equipment 6 is disposed above the solar panel 3 with respect to the work surface 900, and includes a cutting tool 61 for performing physical removal. The removal equipment 6 is configured to be controlled by the control unit 7 to move downward to perform physical removal of the base layer 33 and the solar cell unit 32 of the solar panel 3. The removal equipment 6 may be further configured to measure a height (D4) from the work surface 900 to the top surface of the base layer 33 (hereinafter referred to as "top-base-layer height"), and a cutting-tool height (Z0) from the top surface of the base layer 33 to the cutting tool 61.

In this embodiment, the cutting tool 61 performs physical removal by milling. In some embodiments, the cutting tool 61 may perform physical removal by grinding. The removal equipment 6 may measure the top-base-layer height (D4) and the cutting-tool height (Z0) using optical measurement technologies, such as infrared light or laser beam, to scan the top surface of the base layer 33 and the work surface 900. It should be noted that ways of performing physical removal and ways of measuring the top-base-layer height (D4) and the cutting-tool height (Z0) are not limited to the above-mentioned examples.

Figure 6:
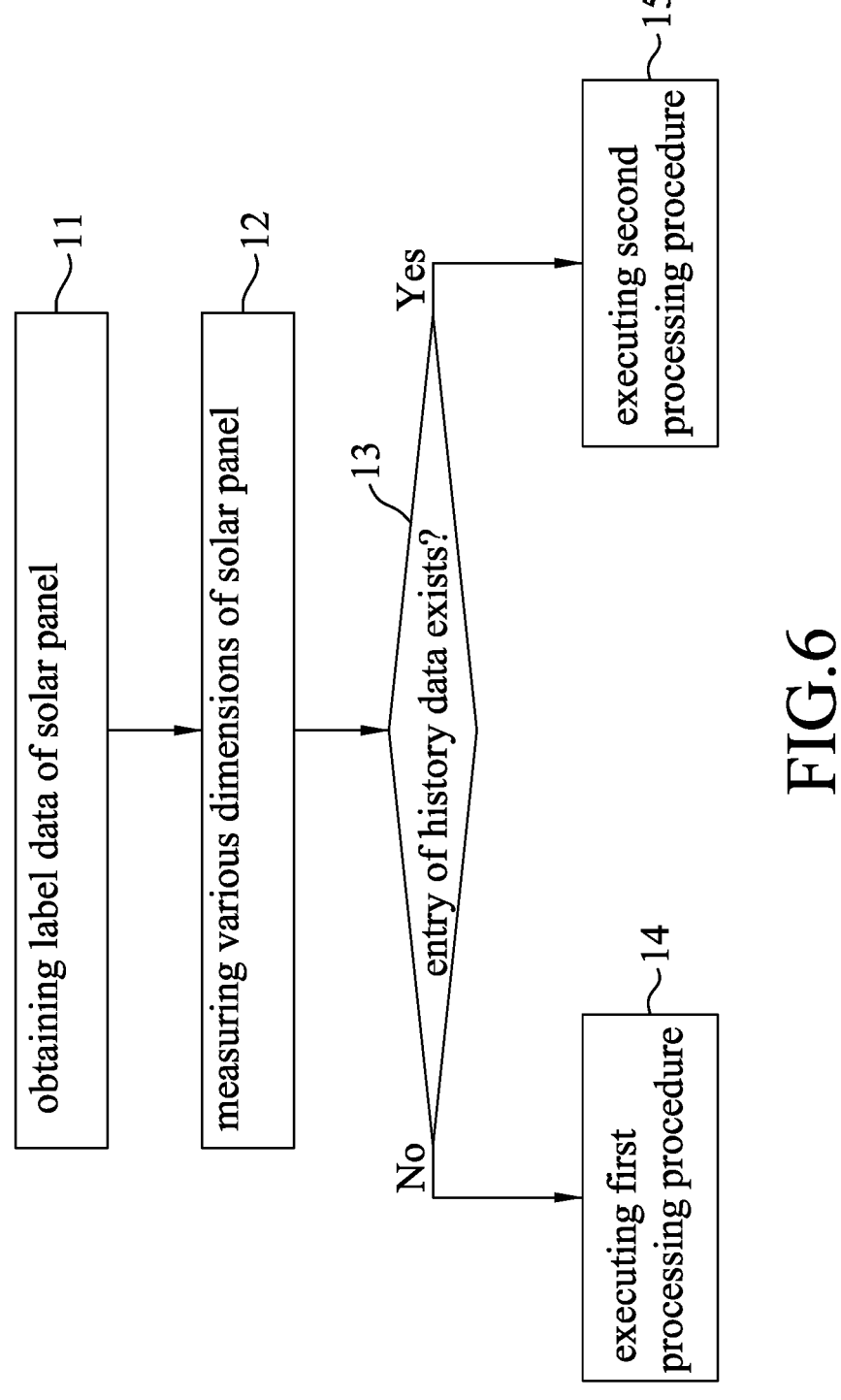
FIG. 6 is a flow chart illustrating a method for recycling the solar panel according to an embodiment of the disclosure.
Figure 7:
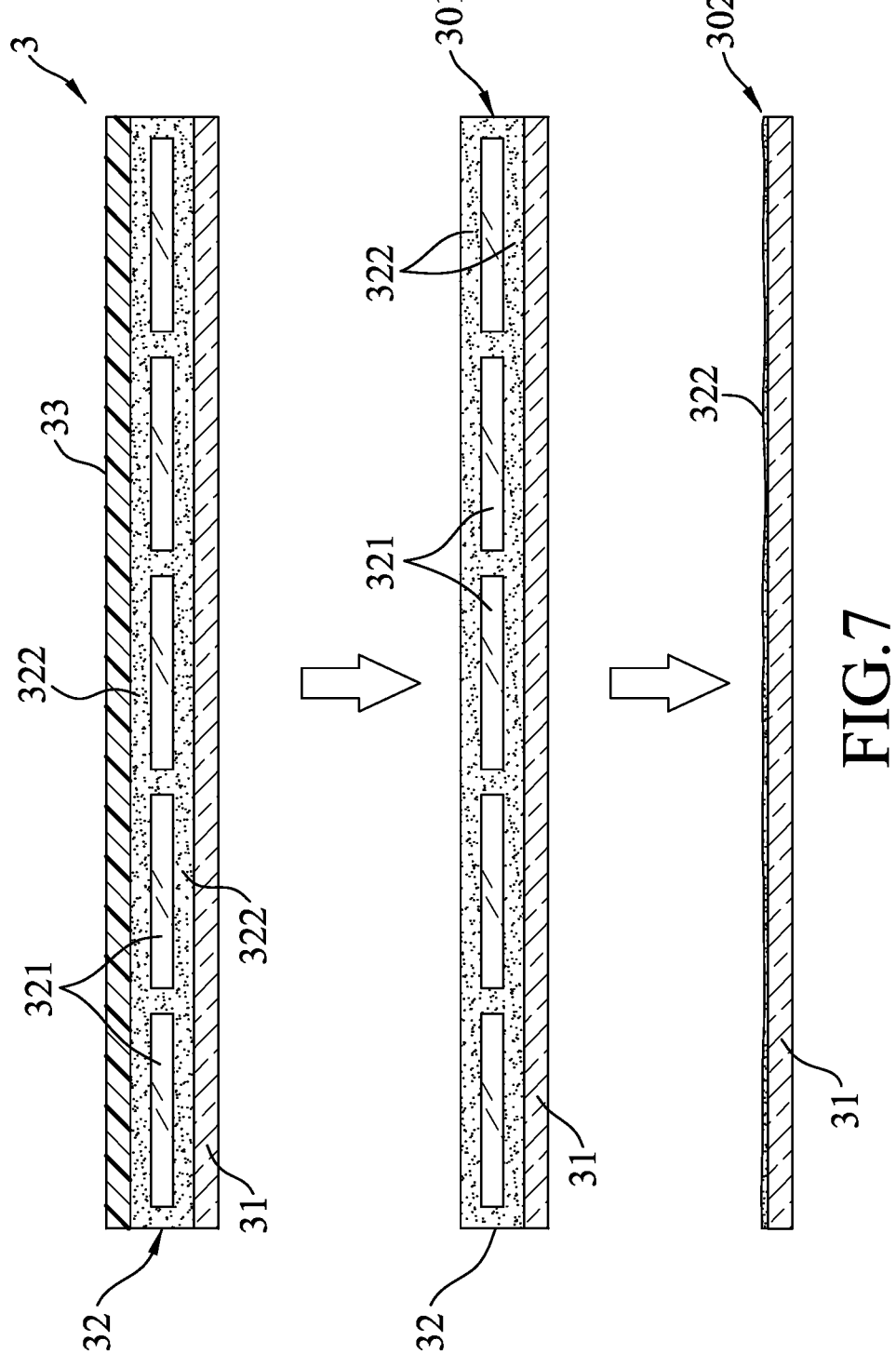
FIG. 7 is a schematic view illustrating a main body remainder and a cover remainder after the solar panel recycling system performs the method for recycling the solar panel.

Referring to FIGS. 1, 2, and 6, the method for recycling the solar panel 3 that is horizontally placed on the work surface 900 is to be implemented by the solar panel recycling system 200, and the method includes steps 11 to 15.

Further referring to FIG. 3, in step 11, the control unit 7 controls the capturing device 4 to face downward (i.e., facing the solar panel 3) to capture an image of the solar panel 3 to obtain the solar panel image, and controls the capturing device 4 to capture an image of the product label 34 that is on the top surface of the base layer 33 to obtain the label data. In this embodiment, the label data is in the form of an image, and the control unit 7 is further configured to perform image analysis and character recognition on the label data to obtain the product information of the solar panel 3. In this embodiment, the product information is printed on the product label 34. The product information may include, but not limited to, a brand name, a model number, or a power specification of the solar panel 3.

In this embodiment, the control unit 7 analyzes the solar panel image to obtain dimensions of the solar panel 3, and then determines a processing area that corresponds to the solar panel 3 based on the dimensions of the solar panel 3. In some embodiments, the base layer 33 of the solar panel 3 may further include one or more junction boxes (not shown) that are disposed on the top surface of the base layer 33, and the control unit 7 is further configured to analyze the solar panel image to obtain junction box data that includes a size and a location of each junction box, and an amount of the one or more junction boxes, and to provide the junction box data to another device, which is used to remove the one or more junction boxes before the solar panel recycling system 200 performs physical removal of the base layer 33. The processing area in these embodiments may include an area where the one or more junction boxes are located.

Referring to FIGS. 1, 2, 4, and 6, in step 12, the control unit 7 controls the measuring equipment 5 to move horizontally with respect to the solar panel 3, and controls the first gauge 51 to emit the first infrared light upwardly to the solar panel 3 while moving horizontally to obtain a base measurement result. The measuring equipment 5 obtains the bottom-base-layer height (D3) based on the base measurement result. The control unit 7 further controls the second gauge 52 to emit the UV light upwardly to the cover layer 31 of the solar panel 3 to obtain a cover measurement result, and the measuring equipment 5 obtains the top-cover-layer height (D1) based on the cover measurement result. The control unit 7 further controls the removal equipment 6 to measure the top-base-layer height (D4) and the cutting-tool height (Z0).

To describe in further detail, when the first gauge 51 emits the first infrared light, the first infrared light travels upward and passes through the cover layer 31 to reach the solar cell unit 32. When the first infrared light hits one of the solar cells 321, the first infrared light would be completely absorbed by the one of the solar cells 321 without being reflected. When the first infrared light passes through one of the gaps among the solar cells 321, the first infrared light may hit the base layer 33 and be reflected by the bottom surface of the base layer 33 and then be received by the first gauge 51.

When the second gauge 52 emits the UV light, the UV light travels upward and hits the cover layer 31 of the solar panel 3. The UV light would be partly absorbed and partly reflected by the cover layer 31 and would be completely absorbed by the adhesive layer 322 of the solar cell unit 32. The second gauge 52 may receive the UV light reflected by the cover layer 31.

In this embodiment, the control unit 7 controls the measuring equipment 5 to move horizontally along a diagonal line that extends through two opposite corners of one of the solar cells 321 and to move across at least two of the solar cells 321 in order to bring the infrared light to pass through the gap between these two of the solar cells 321. The first gauge 51 collects reflection data of the first infrared light (i.e., the base measurement result) to obtain the bottom-base-layer height (D3), and the second gauge 52 collects reflection data of the UV light (i.e., the cover measurement result) to obtain a thickness of the cover layer 31 and the top-cover-layer height (D1). The reflection data of the first infrared light at least includes a length of time counting from the time when the first gauge 51 emits the first infrared light to the time when the first gauge 51 receives the first infrared light reflected by the bottom surface of the base layer 33. The reflection data of the UV light at least includes a length of time counting from the time when the second gauge 52 emits the UV light to the time when the second gauge 52 receives the UV light reflected by the top surface of the cover layer 31 (hereinafter referred to as "first reflection time"), and a length of time counting from the time when the second gauge 52 emits the UV light to the time when the second gauge 52 receives the UV light reflected by a bottom surface of the cover layer 31 (hereinafter referred to as "second reflection time").

The second gauge 52 may be configured to obtain the thickness of the cover layer 31 by calculating a difference between the first reflection time and the second reflection time, and to obtain the top-cover-layer height (D1) using the first reflection time.

In this embodiment, the measuring equipment 5 is very close to the work surface 900 and a distance between the measuring equipment 5 and the work surface 900 is negligible. In some embodiments, the measuring equipment 5 is slightly below the work surface 900 (i.e., there is a gap between the work surface 900 and the measuring equipment 5), and the various heights obtained by the measuring equipment 5 may be calibrated by the control unit 7 to make sure that the heights are with respect to the work surface 900 rather than the measuring equipment 5. It should be noted that, in a case where there is a gap between the work surface 900 and the solar panel 3, the measuring equipment 5 is configured to calibrate for a height difference between the work surface 900 and the bottom surface of the cover layer 31 before measuring the dimensions of the solar panel 3 (i.e., D1 to D4), such that the gap between the work surface 900 and the bottom surface of the cover layer 31 is eliminated.

Referring to FIGS. 1 and 6, in step 13, the control unit 7 obtains a determination on whether an entry of history data that corresponds to the product information of the solar panel 3 exists. The entry of history data corresponding to the product information of the solar panel 3 may include multiple historical parameters used for physical removal of the solar panel 3. In this embodiment, the back-end server 800 has a database including a plurality of entries of history data that correspond respectively to various types of solar panels, the control unit 7 sends the product information obtained in step 11 to the back-end server 800, and the back-end server 800 searches the database for an entry of history data that corresponds to the product information received from the control unit 7. Then, the back-end server 800 determines whether an entry of history data corresponding to the product information exists in the database, and sends the determination back to the control unit 7. In some embodiments, the control unit 7 has the database, directly searches the database thereof for an entry of history data that corresponds to the product information of the solar panel 3, and makes the determination on whether an entry of history data corresponding to the product information exists in the database; in such embodiments, the back-end server 800 may be omitted.

When the determination is that an entry of history data that corresponds to the product information of the solar panel 3 does not exist, the flow of the method proceeds to step 14, in which the control unit 7 executes a first processing procedure. On the other hand, when the determination is that an entry of history data that corresponds to the product information of the solar panel 3 exists, the flow of the method proceeds to step 15, in which the control unit 7 executes a second processing procedure.

Referring to FIGS. 2, 5, 6, and 7, in this embodiment, in the first processing procedure, the control unit 7 takes the top surface of the base layer 33 as a reference level (i.e., the top surface of the base layer 33 is deemed as having a height of zero) to obtain a first removal parameter and a second removal parameter respectively based on the bottom-base-layer height (D3) and the top-cover-layer height (D1). In this embodiment, the control unit 7 controls the cutting tool 61 to descend to the reference level according to the cutting-tool height (Z0), and then controls the cutting tool 61 to move within the processing area that is obtained in step 11 to perform physical removal of the base layer 33 and the solar cell unit 32 respectively according to the first removal parameter and the second removal parameter.

To describe in further detail, the control unit 7 controls the cutting tool 61, according to the first removal parameter, to perform physical removal of a portion of the solar panel 3 that is substantially above the bottom-base-layer height (D3) with respect to the work surface 900 (i.e., removing the base layer 33) to obtain a main body remainder 301. The control unit 7 further controls the cutting tool 61, according to the second removal parameter, to perform physical removal of a portion of the main body remainder 301 that is substantially above the top-cover-layer height (D1) with respect to the work surface 900 (i.e., removing the solar cell unit 32) to obtain a cover remainder 302 that includes at least the cover layer 31. In practice, the cover remainder 302 may further include a residual part of the adhesive layer 322 that is bonded to the cover layer 31.

In this embodiment, the first removal parameter indicates a first distance of descent of the cutting tool 61 relative to the top surface of the base layer 33, where the first distance is a difference between the top-base-layer height (D4) and the bottom-base-layer height (D3). In other words, the first removal parameter is a negative value that indicates the first distance below the reference level and is obtained based on the top-base-layer height (D4) and the bottom-base-layer height (D3), and the control unit 7 controls the cutting tool 61 to descend from the top surface of the base layer 33 by a distance equaling the absolute value of the first removal parameter to physically remove the portion of the solar panel 3. The second removal parameter indicates a second distance of descent of the cutting tool 61 relative to the top surface of the base layer 33, where the second distance is a difference between the top-base-layer height (D4) and the top-cover-layer height (D1). In other words, the second removal parameter is a negative value that indicates the second distance below the reference level and is obtained based on the top-base-layer height (D4) and the top-cover-layer height (D1), and the control unit 7 controls the cutting tool

61 to descend from the top surface of the base layer 33 by a distance equaling the absolute value of the second removal parameter to physically remove the portion of the main body remainder 301.

The cover remainder 302 includes at least the cover layer 31 and may include part of the adhesive layer 322 that is bonded to the top surface of the cover layer 31. One reason of having part of the adhesive layer 322 being left behind is that the cover layer 31 would easily be shattered by the cutting tool 61 if being contacted directly, thus making the cover layer 31 unrecyclable. To prevent the cover layer 31 from being unrecyclable, the second removal parameter is usually designed to allow removal of most of the solar cell unit 32 above the top-cover-layer height (D1) without making the cutting tool 61 contact the cover layer 31, and as a result, part of the adhesive layer 322 may remain on the top surface of the cover layer 31. Other reasons of having part of the adhesive layer 322 being left behind may be that the part of the adhesive layer 322 left behind can be used as a protective pad to buffer potential damage to the cover layer 31 during transportation.

During the first processing procedure, the control unit 7 further controls the capturing device 4 to obtain an image of a top surface of the main body remainder 301 (hereinafter referred to as "base-removed image") and an image of a top surface of the cover remainder 302 (hereinafter referred to as "cover image"). The control unit 7 then analyzes the difference between the base-removed image and the solar panel image to obtain a result of physically removing the portion of the solar panel 3, and analyzes the difference between the cover image and the base-removed image to obtain a result of physically removing the portion of the main body remainder 301.

After performing physical removal of the portion of the solar panel 3 (i.e., when the solar panel 3 has been processed into the main body remainder 301), if the base layer 33 was completely removed from the solar panel 3, the top surface of the main body remainder 301 would appear dark gray; otherwise, part of the top surface of the main body remainder 301 would appear white. The control unit 7 may analyze an area of the base-removed image that appears white after the base layer 33 is removed to obtain the result of physically removing the portion of the solar panel 3. Similarly, after performing physical removal of the portion of the main body remainder 301 (i.e., when the main body remainder 301 has been processed into the cover remainder 302), if the solar cells 321 were completely removed from the solar panel 3, the top surface of the cover remainder 302 would appear gray; otherwise, part of the top surface of the cover remainder 302 would appear black. The control unit 7 may analyze an area of the cover image that appears black after the solar cell unit 32 is removed to obtain the result of physically removing the portion of the main body remainder 301.

Finally, the control unit 7 creates an entry of removal process data (hereinafter referred to as "first entry of removal process data") that corresponds to the solar panel 3 and that includes at least the first removal parameter and the second removal parameter. In some embodiments, the first entry of removal process data may further include the base-removed image, the cover image, the result of physically removing the portion of the solar panel 3, and the result of physically removing the portion of the main body remainder 301 for calibrating and optimizing the first removal parameter and the second removal parameter to be used in the future. The control unit 7 may associate the first entry of removal process data that corresponds to the solar panel 3 with the product information of the solar panel 3, and send the product information of the solar panel 3 and the first entry of removal process data that has been associated with the product information to the back-end server 800. The back-end server 800 may then store, in the database, the first entry of removal process data that has been associated with the product information as an entry of history data that corresponds to the product information of the solar panel 3. In some embodiments where the control unit 7 has the database, the control unit 7 may directly store, in the database, the product information of the solar panel 3 and the first entry of removal process data that has been associated with the product information as an entry of history data that corresponds to the product information of the solar panel 3. The historical parameters of the entry of history data thus stored include a first historical parameter, which is the first removal parameter from the first entry of removal process data that corresponds to the solar panel 3, and a second historical parameter, which is the second removal parameter from the first entry of removal process data that corresponds to the solar panel 3.

As mentioned previously, when the determination is that an entry of history data corresponding to the product information of the solar panel 3 exists (hereinafter referred to as "reference data"), the control unit 7 executes the second processing procedure. In such case, a solar panel with the same specifications as the solar panel 3 has been processed by the solar panel recycling system 200 before, and an entry of removal process data related thereto is stored in the database. In this embodiment, in the second processing procedure, the control unit 7 takes the top surface of the base layer 33 as the reference to obtain the first removal parameter and the second removal parameter respectively based on the bottom-base-layer height (D3) and the top-cover-layer height (D1). The first removal parameter and the second removal parameter are obtained in the same manner as described in the foregoing paragraphs related to the first processing procedure, and details thereof are omitted herein for the sake of brevity.

The control unit 7 analyzes a first difference between the first removal parameter and a first historical parameter that is from the reference data, and analyzes a second difference between the second removal parameter and a second historical parameter that is from the reference data. It should be noted that the first historical parameter and the second historical parameter are parameters that are most recently stored in the reference data and that were respectively used to process a solar panel with the same specifications as the solar panel 3.

The control unit 7 selects the first removal parameter when the control unit 7 determines that the first difference is greater than a first threshold, and selects the first historical parameter when otherwise. Similarly, the control unit 7 selects the second removal parameter when the control unit 7 determines that the second difference is greater than a second threshold, and selects the second historical parameter when otherwise. It should be noted that the first threshold and the second threshold may be identical to or different from each other.

In the second processing procedure, the control unit 7 controls the cutting tool 61 to descend to the reference level according to the cutting-tool height (Z0), and then controls the cutting tool 61 to move within the processing area that is obtained in step 11 to perform physical removal of the base layer 33 according to the selected one of the first removal parameter and the first historical parameter, and to perform physical removal of the solar cell unit 32 according to the selected one of the second removal parameter or the second historical parameter.

To describe in further detail, the control unit 7 controls the cutting tool 61, according to the selected one of the first removal parameter and the first historical parameter, to descend from the top surface of the base layer 33 by a distance equaling the absolute value of selected one of the first removal parameter and the first historical parameter to perform physical removal of the portion of the solar panel 3 to obtain the main body remainder 301. The control unit 7 further controls the cutting tool 61, according to the selected one of the second removal parameter and the second historical parameter, to descend from the top surface of the base layer 33 by a distance equaling the absolute value of selected one of the second removal parameter and the second historical parameter to perform physical removal of the portion of the main body remainder 301 to obtain the cover remainder 302.

During the second processing procedure, the control unit 7 further controls the capturing device 4 to obtain the base-removed image of the top surface of the main body remainder 301 and the cover image of the top surface of the cover remainder 302. The control unit 7 then analyzes the difference between the base-removed image and the solar panel image to obtain the result of physically removing the portion of the solar panel 3, and analyzes the difference between the cover image and the base-removed image to obtain the result of physically removing the portion of the main body remainder 301.

Finally, the control unit 7 also creates an entry of removal process data (hereinafter referred to as "second entry of removal process data") that corresponds to the solar panel 3 and that at least includes the selected one of the first removal parameter and the first historical parameter, and the selected one of the second removal parameter and the second historical parameter. In some embodiments, the second entry of removal process data created in the second processing procedure may further include the base-removed image, the cover image, the result of physically removing the portion of the solar panel 3, and the result of physically removing the portion of the main body remainder 301. The control unit 7 may associate the second entry of removal process data that corresponds to the solar panel 3 with the product information of the solar panel 3, and send the product information of the solar panel 3 and the second entry of removal process data that has been associated with the product information to the back-end server 800. The back-end server 800 may then update the entry of history data that is stored in the database of the back-end server 800 with the second entry of removal process data that has been associated with the product information (i.e., the second entry of removal process data that has been added into the entry of history data is now the most recently stored data of the entry of history data and may be used in the second processing procedure). In some embodiments where the control unit 7 has the database, the control unit 7 may directly update the entry of history data that is stored in the database of the control unit 7 with the second entry of removal process data that has been associated with the product information.

In the abovementioned embodiment, the control unit 7 takes the top surface of the base layer 33 as the reference level. In some embodiments, the control unit 7 may take the work surface 900 as the reference level (i.e., the work surface 900 is deemed as having a height of zero), and steps 14 and 15 may be executed as described below.

In step 14, the control unit 7 takes the work surface 900 as the reference level to obtain the first removal parameter and the second removal parameter respectively based on the bottom-base-layer height (D3) and the top-cover-layer height (D1). In this embodiment, the control unit 7 controls the cutting tool 61 to move within the processing area that is obtained in step 11 to perform physical removal of the base layer 33 and the solar cell unit 32 respectively according to the first removal parameter and the second removal parameter.

In this embodiment, the first removal parameter indicates a first height that the cutting tool 61 should be at (relative to the work surface 900) when removing the portion of the solar panel 3, where the first height is equal to the bottom-base-layer height (D3). In other words, the first removal parameter is a positive value that indicates the first height above the reference level. The second removal parameter indicates a second height that the cutting tool 61 should be at (relative to the work surface 900) when removing the portion of the main body remainder 301, where the second height is equal to the top-cover-layer height (D1). In other words, the second removal parameter is another positive value that indicates the second height above the reference level.

The control unit 7 controls the cutting tool 61 to descend from above the solar panel 3 to a first level at the first height relative to the work surface 900 according to the first removal parameter to perform physical removal of the base layer 33 to obtain the main body remainder 301. The control unit 7 then controls the cutting tool 61 to descend from the first level to a second level at the second height relative to the work surface 900 according to the second removal parameter to perform physical removal of the solar cell unit 32 to obtain the cover remainder 302.

In step 15, the control unit 7 takes the work surface 900 as the reference level to obtain the first removal parameter and the second removal parameter respectively based on the bottom-base-layer height (D3) and the top-cover-layer height (D1). The control unit 7 analyzes the first difference between the first removal parameter and the first historical parameter, and analyzes the second difference between the second removal parameter and the second historical parameter. The control unit 7 then selects either the first removal parameter or the first historical parameter based on the first difference and the first threshold, and selects either the second removal parameter or the second historical parameter based on the second difference and the second threshold.

The control unit 7 controls the cutting tool 61 to descend to the first level at the first height relative to the work surface 900, according to the selected one of the first removal parameter and the first historical parameter, to perform physical removal of the base layer 33 to obtain the main body remainder 301. The control unit 7 then controls the cutting tool 61 to descend to the second level at the second height relative to the work surface 900, according to the selected one of the second removal parameter and the second historical parameter, to perform physical removal of the solar cell unit 32 to obtain the cover remainder 302.

In some embodiments, the first gauge 51 may further emit a second infrared light with a third power to measure a height (D2) from the work surface 900 to a bottom surface of one of the solar cells 321 (hereinafter referred to as "bottom-solar-cell height"). In one example, the third power is designed so that the second infrared light is not completely absorbed by the solar cells 321 (i.e., the second infrared light is partly absorbed and partly reflected by the solar cells 321), and though the second infrared light is able to pass through one of the gaps among the solar cells 321 toward the base layer 33 and be reflected by the bottom surface of the base layer 33, a luminous flux of the second infrared light that is reflected by the base layer 33 is outside a measurable range of the first gauge 51. It should be noted that the third power of the second infrared light is greater than the first power of the first infrared light.

In this case, in step 12, the control unit 7 further controls the first gauge 51 to emit the second infrared light upwardly to the solar panel 3 while moving horizontally to obtain a solar cell measurement result. The measuring equipment 5 obtains the bottom-solar-cell height (D2) based on the solar cell measurement result. The solar cell measurement result at least includes a length of time counting from the time when the first gauge 51 emits the second infrared light to the time when the first gauge 51 receives the second infrared light reflected by the solar cells 321.

To describe in further detail, when the first gauge 51 emits the second infrared light, the second infrared light travels upward and passes through the cover layer 31 to reach the solar cell unit 32. Since the third power of the second infrared light is greater than the first power of the first infrared light and the second infrared light is unable to be completely absorbed by the solar cells 321, when the second infrared light hits one of the solar cells 321, the second infrared light would be partly absorbed and partly reflected by said one of the solar cells 321, and thus be received by the first gauge 51. When the second infrared light passes through one of the gaps among the solar cells 321, the second infrared light may hit the base layer 33 and be reflected by the bottom surface of the base layer 33. In this embodiment, the amount of the second infrared light reflected by the base layer 33 is outside the measurable range of the first gauge 51 and would be considered by the first gauge 51 as noise (i.e., only a part of the second infrared light reflected by the solar cells 321 is measured by the first gauge 51).

In this embodiment, the control unit 7 obtains the first removal parameter based on the top-cover-layer height (D1) and the bottom-base-layer height (D3), and obtains the second removal parameter based on the top-cover-layer height (D1), the bottom-base-layer height (D3), and the top-base-layer height (D4). In some embodiments, the control unit 7 obtains the second removal parameter further based on the bottom-solar-cell height (D2) for optimizing the second removal parameter so as to keep part of the adhesive layer 322 on the top surface of the cover layer 31 as buffer. To describe in further detail, the second removal parameter is obtained for performing physical removal of a portion of the solar cell unit 32 that is above an intermediate height which is between the top-cover-layer height (D1) and the bottom-solar-cell height (D2).

In this embodiment, the product label 34 of the solar panel 3 is a sticker with product information printed thereon, the capturing device 4 (e.g., a camera) captures an image of the product label 34 using image capturing technology to obtain the label data in the form of an image, and the control unit 7 performs image analysis on the image of the product label 34 to obtain the product information of the solar panel 3.

In some embodiments, the product label 34 may be a wirelessly readable tag that has the label data encoded therein, and the wirelessly readable tag may be a radio frequency identification (RFID) tag, a near field communication (NFC) tag, or a quick response (QR) code, etc. The capturing device 4 may include a reader (e.g., an RFID reader, an NFC reader, a QR code reader, etc.) configured to read the product label 34 using wireless communication technology so that the capturing device 4 is able to obtain the label data encoded in the wireless readable tag. The label data thus obtained may include a unique identifier of the solar panel 3, and may further include the product information of the solar panel 3.

The back-end server 800 or the control unit 7 may store a plurality of pieces of product information that respectively correspond to different unique identifiers respectively of different types of solar panels that are of different models. In a case where the label data only includes the unique identifier of the solar panel 3 that is to be recycled, the control unit 7 may obtain the unique identifier from the capturing device 4, and the back-end server 800 or the control unit 7 may obtain the product information that corresponds to the solar panel 3 according to the unique identifier thus obtained. In another case where the label data includes the unique identifier and the product information of the solar panel 3, the control unit 7 may be designed to directly read the label data to obtain the product information of the solar panel 3.

Therefore, in some embodiments, in step 11, in addition to obtaining the solar panel image, the control unit 7 may further control the capturing device 4 to read the product label 34 using wireless communication technology to obtain the label data encoded therein, and the control unit 7 or the back-end server 800 may obtain the product information of the solar panel 3 according to the label data.

In summary, the method of recycling a solar panel and the solar panel recycling system 200 provided in the disclosure are able to automatically determine whether an entry of history data that corresponds to the solar panel 3 that is to be recycled by the solar panel recycling system 200 exists in the back-end server 800 or the control unit 7. When it is determined that an entry of history data that corresponds to the solar panel 3 does not exist, the solar panel recycling system 200 automatically removes and recycles the base layer 33 and the solar cell unit 32 respectively according to the first removal parameter and the second removal parameter, recycles the cover layer 31 as a whole, associates the entry of removal process data with the product information of the solar panel 3, and stores the entry of removal process data as an entry of history data that corresponds to the solar panel 3 in the back-end server 800 or the control unit 7 for future use.

When it is determined that an entry of history data that corresponds to the solar panel 3 exists, the solar panel recycling system 200 determines whether to select the first removal parameter or the first historical parameter and whether to select the second removal parameter or the second historical parameter, and then automatically removes and recycles the base layer 33 and the solar cell unit 32 respectively according to the selected one of the first removal parameter and the first historical parameter, and the selected one of the second removal parameter and the second historical parameter, recycles the cover layer 31 as a whole, associates the entry of removal process data with the product information of the solar panel 3, and using the entry of removal process data to update the entry of history data that corresponds to the solar panel 3 in the back-end server 800 or the control unit 7 for future use.

That is to say, the method of recycling a solar panel and the solar panel recycling system 200 provided in the disclosure are able to automatically create or update entries of the history data that respectively correspond to different types of solar panels, which may serve as reference data for subsequent recycling of the same types of solar panels. The method may also increase efficiency of recycling and purity of the recycled materials by automatically adapting to solar panels having different specifications using appropriate removal parameters.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A method for recycling a solar panel, the method to be implemented by a solar panel recycling system that includes a measuring equipment, a removal equipment, a capturing device and a control unit, the solar panel including a cover layer and a base layer, and having a product label attached thereon, the solar panel being placed horizontally on a work surface of a workbench with the cover layer facing the work surface, the method comprising steps of:

the measuring equipment measuring a first height from the work surface to a top surface of the cover layer of the solar panel, and a second height from the work surface to a bottom surface of the base layer of the solar panel;

the capturing device obtaining label data from the product label of the solar panel, and the control unit obtaining product information of the solar panel according to the label data obtained from the capturing device, and the control unit obtaining a determination on whether an entry of history data that corresponds to the product information exists;

in response to the determination being that an entry of history data that corresponds to the product information does not exist, the control unit executing a first processing procedure that includes obtaining a first removal parameter that is related to the base layer and a second removal parameter that is related to the cover layer respectively based on the second height and the first height, controlling the removal equipment, according to the first removal parameter, to physically remove a portion of the solar panel that is substantially above the second height with respect to the work surface so as to obtain a main body remainder, and controlling the removal equipment, according to the second removal parameter, to physically remove a portion of the main body remainder that is substantially above the first height with respect to the work surface so as to obtain a cover remainder that includes at least the cover layer; and in response to the determination being that an entry of history data that corresponds to the product information exists, the control unit executing a second processing procedure that includes obtaining the first removal parameter and the second removal parameter respectively based on the second height and the first height, analyzing a first difference between the first removal parameter and a first historical parameter that is from the entry of history data, and analyzing a second difference between the second removal parameter and a second historical parameter that is from the entry of history data, selecting the first removal parameter in response to the control unit determining that the first difference is greater than a first threshold, and selecting the first historical parameter in response to otherwise, selecting the second removal parameter in response to the control unit determining that the second difference is greater than a second threshold, and selecting the second historical parameter in response to otherwise, controlling the removal equipment, according to one of the first removal parameter and the first historical parameter thus selected, to physically remove the portion of the solar panel that is substantially above the second height with respect to the work surface so as to obtain the main body remainder, and controlling the removal equipment, according to one of the second removal parameter and the second historical parameter thus selected, to physically remove the portion of the main body remainder that is substantially above the first height with respect to the work surface so as to obtain the cover remainder.

2. The method as claimed in claim 1, the removal equipment being disposed above the solar panel with respect to the work surface and including a cutting tool for performing physical removal, wherein, in the first processing procedure, the control unit takes the work surface as a reference to obtain the first removal parameter and the second removal parameter, controls the cutting tool to descend from above the solar panel to a first level with respect to the work surface according to the first removal parameter to physically remove the portion of the solar panel, and controls the cutting tool to descend from the first level to a second level with respect to the work surface according to the second removal parameter to physically remove the portion of the main body remainder, wherein, in the second processing procedure, the control unit takes the work surface as the reference to obtain the first removal parameter and the second removal parameter, controls the cutting tool to descend from above the solar panel to a third level with respect to the work surface according to said one of the first removal parameter and the first historical parameter to physically remove the portion of the solar panel, and controls the cutting tool to descend from the third level to a fourth level with respect to the work surface according to said one of the second removal parameter and the second historical parameter to physically remove the portion of the main body remainder.

3. The method as claimed in claim 1, the removal equipment being disposed above the solar panel with respect to the work surface and including a cutting tool for performing physical removal, the method further comprising the measuring equipment measuring a third height from the work surface to a top surface of the base layer, wherein, in the first processing procedure, the control unit takes the top surface of the base layer as a reference to obtain the first removal parameter and the second removal parameter further based on the third height, controls the cutting tool to descend from the top surface of the base layer by a first distance according to the first removal parameter to physically remove the portion of the solar panel, and controls the cutting tool to descend from the top surface of the base layer by a second distance according to the second removal parameter to physically remove the portion of the main body remainder, wherein, in the second processing procedure, the control unit takes the top surface of the base layer as the reference to obtain the first removal parameter and the second removal parameter further based on the third height, controls the cutting tool to descend from the top surface of the base layer by a third distance according to said one of the first removal parameter and the first historical parameter to physically remove the portion of the solar panel, and controls the cutting tool to descend from the top surface of the base layer by a fourth distance according to said one of the second removal parameter and the second historical parameter to physically remove the portion of the main body remainder.

4. The method as claimed in claim 1, wherein in each of the first processing procedure and the second processing procedure, the control unit further controls the capturing device to obtain a base-removed image of a top surface of the main body remainder, and analyzes the base-removed image to obtain a result of physically removing the portion of the solar panel.

5. The method as claimed in claim 1, wherein in each of the first processing procedure and the second processing procedure, the control unit further controls the capturing device to obtain a cover image of a top surface of the cover remainder, and analyzes the cover image to obtain a result of physically removing the portion of the main body remainder.

6. The method as claimed in claim 1, the solar panel further including at least two solar cells spaced apart from each other and disposed between the cover layer and the base layer, wherein, in the step of measuring the first height and the second height, in response to the measuring equipment moving horizontally with respect to the solar panel, the measuring equipment emits an infrared light with a first power to the solar panel while moving horizontally in order to bring the infrared light to pass through a gap between the solar cells of the solar panel toward the base layer to obtain a base measurement result, and obtains the second height based on the base measurement result, the infrared light with the first power being able to be completely absorbed by the solar cells and reflected by the base layer.

7. The method as claimed in claim 6, wherein
in the step of measuring the first height and the second height, the measuring equipment further emits an ultraviolet light with a second power to the cover layer of the solar panel to obtain a cover measurement result, and the measuring equipment obtains the first height based on the cover measurement result, the ultraviolet light with the second power being able to be partly absorbed by the cover layer and partly reflected by the cover layer.

8. The method as claimed in claim 1, further comprising:
the capturing device obtaining a solar panel image of the solar panel that is placed on the work surface; and
the control unit analyzing the solar panel image to obtain a processing area that corresponds to the solar panel,
wherein, in the first processing procedure, the control unit controls the removal equipment to move, with respect to the solar panel, within the processing area to perform physical removal.

9. The method as claimed in claim 1, the product label being a wirelessly readable tag having the label data encoded therein,
wherein, in the step of obtaining the label data from the product label, the capturing device obtains the label data by reading the product label using wireless communication technology.

10. The method as claimed in claim 1, the product label containing the product information,
wherein, in the step of obtaining the label data and obtaining the product information, the capturing device captures an image of the product label as the label data, and the control unit performs image analysis and character recognition on the image of the product label to obtain the product information.

11. The method as claimed in claim 1, wherein, in the first processing procedure, the control unit further controls the capturing device to obtain a base-removed image of a top surface of the main body remainder, and analyzes the base-removed image to obtain a result of physically removing the portion of the solar panel.

12. The method as claimed in claim 1, wherein, in the first processing procedure, the control unit further controls the capturing device to obtain a cover image from a top surface of the cover remainder, and analyzes the cover image to obtain a result of physically removing the portion of the main body remainder.

13. The method as claimed in claim 1, the measuring equipment being placed below the solar panel with respect to the work surface,
wherein, in the step of measuring the first height and the second height, the measuring equipment moves horizontally with respect to the solar panel, and obtains the first height and the second height using optical measurement technology while moving horizontally with respect to the solar panel.

14. The method as claimed in claim 13, the solar panel further including at least two solar cells spaced apart from each other and disposed between the cover layer and the base layer,
wherein, in the step of measuring the first height and the second height, in response to the measuring equipment moving horizontally with respect to the solar panel, the measuring equipment emits an infrared light with a first power to the solar panel while moving horizontally in order to bring the infrared light to pass through a gap between the solar cells of the solar panel toward the base layer to obtain a base measurement result, and obtains the second height based on the base measurement result, the infrared light with the first power being able to be completely absorbed by the solar cells and reflected by the base layer.

15. The method as claimed in claim 14, wherein, in the first processing procedure, in the step of measuring the first height and the second height, the measuring equipment further emits an ultraviolet light with a second power to the cover layer of the solar panel to obtain a cover measurement result, and the measuring equipment obtains the first height based on the cover measurement result, the ultraviolet light with the second power being able to be partly absorbed by the cover layer and partly reflected by the cover layer.

16. A solar panel recycling system adapted to implement a method for recycling a solar panel as claimed in claim 1, the solar panel including a cover layer and a base layer and having a product label attached thereon, the solar panel being placed horizontally on a work surface of a workbench with the cover layer facing the work surface, said solar panel recycling system comprising:
a capturing device configured to obtain label data from the product label of the solar panel;
a measuring equipment configured to measure a first height from the work surface to a top surface of the cover layer of the solar panel, and a second height from the work surface to a bottom surface of the base layer of the solar panel;
a removal equipment configured to perform physical removal; and
a control unit configured to obtain product information of the solar panel according to the label data obtained from said capturing device, to obtain a determination on whether an entry of history data corresponding to the product information exists, and to execute a first processing procedure, in response to the determination being that an entry of history data corresponding to the product information does not exist, by
obtaining a first removal parameter that is related to the base layer and a second removal parameter that is related to the cover layer respectively based on the second height and the first height,
controlling said removal equipment, according to the first removal parameter, to physically remove a portion of the solar panel that is substantially above the second height with respect to the work surface to obtain a main body remainder, and
controlling said removal equipment, according to the second removal parameter, to physically remove a portion of the main body remainder that is substantially above the first height with respect to the work surface to obtain a cover remainder that includes at least the cover layer;
wherein said control unit is further configured to execute a second processing procedure, in response to the determination being that an entry of history data corresponding to the product information exists, by
obtaining the first removal parameter and the second removal parameter respectively based on the second height and the first height,
analyzing a first difference between the first removal parameter and a first historical parameter that is from the entry of history data, and analyzing a second difference between the second removal parameter and a second historical parameter that is from the entry of history data, selecting the first removal parameter when determining that the first difference is greater than a first threshold, and selecting the first historical parameter when otherwise, selecting the second removal parameter when determining that the second difference is greater than a second threshold, and selecting the second historical parameter when otherwise, controlling said removal equipment, according to one of the first removal parameter and the first historical parameter thus selected, to physically remove the portion of the solar panel that is substantially above the second height with respect to the work surface to obtain the main body remainder, and controlling said removal equipment, according to one of the second removal parameter and the second historical parameter thus selected, to physically remove the portion of the main body remainder that is substantially above the first height with respect to the work surface to obtain the cover remainder.

17. The solar panel recycling system as claimed in claim 16, wherein:

said removal equipment is configured to be disposed above the solar panel with respect to the work surface, and includes a cutting tool for performing physical removal;

said control unit is configured to take the work surface as a reference to obtain the first removal parameter and the second removal parameter;

said control unit is configured to, when executing the first processing procedure, control said cutting tool to descend from above the solar panel to a first level with respect to the work surface according to the first removal parameter to physically remove the portion of the solar panel, and control said cutting tool to descend from the first level to a second level with respect to the work surface according to the second removal parameter to physically remove the portion of the main body remainder; and said control unit is configured to, when executing the second processing procedure, control said cutting tool to descend from above the solar panel to a third level with respect to the work surface according to said one of the first removal parameter and the first historical parameter to physically remove the portion of the solar panel, and control said cutting tool to descend from the third level to a fourth level with respect to the work surface according to said one of the second removal parameter and the second historical parameter to physically remove the portion of the main body remainder.

18. The solar panel recycling system as claimed in claim 16, wherein:

said removal equipment is configured to be disposed above the solar panel with respect to the work surface and includes a cutting tool for performing physical removal;

said measuring equipment is further configured to measure a third height from the work surface to a top surface of the base layer;

said control unit is configured to take the top surface of the base layer as a reference to obtain the first removal parameter and the second removal parameter further based on the third height;

said control unit is configured to, when executing the first processing procedure, control said cutting tool to descend from the top surface of the base layer by a first distance according to the first removal parameter to physically remove the portion of the solar panel, and control said cutting tool to descend from the top surface of the base layer by a second distance according to the second removal parameter to physically remove the portion of the main body remainder; and said control unit is configured to, when executing the second processing procedure, control said cutting tool to descend from the top surface of the base layer by a third distance according to said one of the first removal parameter and the first historical parameter to physically remove the portion of the solar panel, and control said cutting tool to descend from the top surface of the base layer by a fourth distance according to said one of the second removal parameter and the second historical parameter to physically remove the portion of the main body remainder.

19. A method for recycling a solar panel, the method to be implemented by a solar panel recycling system that includes a measuring equipment, a removal equipment and a control unit, the solar panel including a cover layer and a base layer, the solar panel being placed horizontally on a work surface of a workbench with the cover layer facing the work surface, the measuring equipment being placed below the solar panel with respect to the work surface, the method comprising steps of:

the measuring equipment measuring a first height from the work surface to a top surface of the cover layer of the solar panel, and a second height from the work surface to a bottom surface of the base layer of the solar panel; and the control unit executing a first processing procedure that includes obtaining a first removal parameter that is related to the base layer and a second removal parameter that is related to the cover layer respectively based on the second height and the first height, controlling the removal equipment, according to the first removal parameter, to physically remove a portion of the solar panel that is substantially above the second height with respect to the work surface so as to obtain a main body remainder, and controlling the removal equipment, according to the second removal parameter, to physically remove a portion of the main body remainder that is substantially above the first height with respect to the work surface so as to obtain a cover remainder that includes at least the cover layer, wherein, in the step of measuring the first height and the second height, the measuring equipment moves horizontally with respect to the solar panel, and obtains the first height and the second height using optical measurement technology while moving horizontally with respect to the solar panel.

20. The method as claimed in claim 19, the solar panel further including at least two solar cells spaced apart from each other and disposed between the cover layer and the base layer, wherein, in the step of measuring the first height and the second height, in response to the measuring equipment moving horizontally with respect to the solar panel, the measuring equipment emits an infrared light with a first power to the solar panel while moving horizontally in order to bring the infrared light to pass through a gap between the solar cells of the solar panel toward the base layer to obtain a base measurement result, and obtains the second height based on the base measurement result, the infrared light with the first power being able to be completely absorbed by the solar cells and reflected by the base layer.

\* \* \* \* \*